United States Patent
Shirley

(10) Patent No.: US 6,872,254 B2
(45) Date of Patent: Mar. 29, 2005

(54) METHOD AND APPARATUS FOR CONTROLLING AIR OVER A SPINNING MICROELECTRONIC SUBSTRATE

(75) Inventor: Paul D. Shirley, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/458,419

(22) Filed: Jun. 9, 2003

(65) Prior Publication Data
US 2003/0211232 A1 Nov. 13, 2003

Related U.S. Application Data

(60) Continuation of application No. 09/859,601, filed on May 16, 2001, now Pat. No. 6,576,055, which is a division of application No. 09/384,830, filed on Aug. 27, 1999, now Pat. No. 6,261,635.

(51) Int. Cl.[7] .......................... B05C 13/00; B05C 15/00
(52) U.S. Cl. ............................... 118/52; 118/56; 118/64; 118/70
(58) Field of Search ....................... 118/52, 320, 56, 118/501, 500, 504, 50, 64, 72, 315; 427/240, 425, 782, 409, 758

(56) References Cited

U.S. PATENT DOCUMENTS

| | | | |
|---|---|---|---|
| 4,800,836 A | 1/1989 | Yamamoto et al. ............ | 118/52 |
| 5,211,753 A | 5/1993 | Swain ........................... | 118/52 |
| 5,238,713 A | 8/1993 | Sago et al. ................... | 427/240 |
| 5,472,502 A | 12/1995 | Batchelder ................... | 118/52 |
| 5,518,542 A | 5/1996 | Matsukawa et al. .......... | 118/52 |
| 5,658,615 A * | 8/1997 | Hasebe et al. .............. | 427/240 |
| 5,688,322 A | 11/1997 | Motoda et al. ............... | 118/52 |
| 5,695,817 A * | 12/1997 | Tateyama et al. ........... | 427/240 |
| 5,985,357 A * | 11/1999 | Sanada ......................... | 427/8 |
| 6,063,190 A | 5/2000 | Hasebe et al. ................ | 118/52 |
| 6,103,680 A | 8/2000 | Honda et al. ............... | 510/178 |
| 6,159,288 A | 12/2000 | Satou et al. .................. | 118/70 |
| 6,197,385 B1 | 3/2001 | Takeshita et al. ........... | 427/425 |
| 6,221,787 B1 | 4/2001 | Ogata ......................... | 438/758 |
| 6,284,043 B1 | 9/2001 | Takekuma .................... | 118/52 |
| 6,361,600 B1 * | 3/2002 | Tateyama et al. ............ | 118/56 |
| 6,576,055 B2 * | 6/2003 | Shirley ......................... | 118/52 |

* cited by examiner

Primary Examiner—Christopher A. Fiorilla
Assistant Examiner—George R. Koch, III
(74) Attorney, Agent, or Firm—Dorsey & Whitney

(57) ABSTRACT

A method and apparatus for forming a generally uniform liquid layer on a surface of an upper surface microelectronic substrate. The apparatus can include a support that engages less than the entire lower surface of the microelectronic substrate and rotates the microelectronic substrate at a selected rate. A barrier can extend over the upper surface of the microelectronic substrate and can rotate at about the same rate as the substrate to separate a rotating air mass adjacent to the upper surface and within the barrier from a stationary air mass external to the barrier. The rotating air mass can reduce the likelihood for liquid/air interface disturbances that create non-uniformities in the liquid layer. Accordingly, the method and apparatus can increase the range of thicknesses to which the liquid layer can be formed and can reduce the topographical non-uniformities of the liquid layer.

11 Claims, 4 Drawing Sheets

METHOD AND APPARATUS FOR CONTROLLING AIR OVER A SPINNING MICROELECTRONIC SUBSTRATE

CROSS-REFERENCE TO RELATED APPLICATIONS

This application is a continuation of U.S. patent application Ser. No. 09/859,601, filed May 16, 2001, issued Jun. 10, 2003 as U.S. Pat. No. 6,576,055 B2, which is a divisional of U.S. patent application No. Ser. 09/384,830, Aug. 27, 1999, issued Jul. 17, 2001 as U.S. Pat. No. 6,261,635 B1.

TECHNICAL FIELD

The present invention is directed toward methods and apparatuses for controlling the movement of air over a spinning microelectronic substrate, for example during application of a liquid to the microelectronic substrate.

BACKGROUND OF THE INVENTION

During the manufacture of microelectronic devices, such as memory chips, processor chips and field emission displays, etching processes are often used to form features on a microelectronic substrate or substrate assembly that forms the foundation of the device. A typical etching technique includes depositing a layer of a photoresist material on the substrate, masking selected portions of the layer and exposing the unmasked portions to a selected radiation. The selected radiation changes the solubility of the unmasked portions to become either soluble (in the case of a positive photoresist) or insoluble (in the case of a negative photoresist) when exposed to a selected solvent. The photoresist layer is then washed with the selected solvent to remove either the exposed or unexposed photoresist material, exposing a portion of the substrate beneath. The substrate is washed with an etchant that removes material from the exposed portions of the substrate while leaving intact the portions of the substrate covered by the photoresist material.

It is often important to control the uniformity of the thickness to which the photoresist material is deposited on the substrate. For example, if the photoresist material is deposited to a nonuniform thickness, certain portions of the photoresist material may be overexposed to the radiation while other portions may be underexposed. Where the photoresist material is overexposed, the edges between the masked and unmasked regions can become blurred, making the process unsuitable for forming very, small features. Where the photoresist material is underexposed, it may not have sufficient exposure time to change solubility. Furthermore, it may be desirable to keep the overall thickness of the photoresistant layer relatively small to increase the resolution of the features formed with this technique.

The photoresist material is typically deposited on the substrate or substrate assembly by disposing the material in liquid form at the center of the substrate and spinning the substrate about its center to spread the material outwardly by centrifugal force. One drawback with this technique is that the liquid photoresist material can interact with the adjacent air mass, creating waves or other disturbances in the photoresist material that affect the uniformity of the layer thickness. This problem can become more acute when the velocity of the substrate increases, for example, when the substrate is rotated at a high angular velocity and/or when the substrate has a large radius so that at even moderate angular velocities, the linear speed toward the edge of the substrate is high.

Another drawback with this technique is that the convective heat transfer rate can vary over the surface of the substrate because the relative linear velocity between the substrate and the adjacent air mass varies with the distance from the substrate center. The variation in heat transfer rates can cause the surface temperature of the substrate to vary, in turn causing the evaporation rate of the fluid (and therefore the thickness of the fluid) to vary over surface of the substrate.

Yet another drawback with this technique is that the viscosity selected for the liquid photoresist material must account for the diameter and rotation speed of the substrate. For example, a relatively viscous liquid may be selected for large substrates to prevent the liquid from flying off the edges of the substrate before accumulating to the desired thickness. Such a liquid may be too viscous for smaller substrates. Accordingly, conventional techniques typically use liquids with different viscosities to form layers having different thicknesses. For example, less viscous liquids can be used to form thinner layers and more viscous liquids can be used to form thicker layers. One problem with this approach is that it requires controlling and/or adjusting the viscosity of the liquid and/or providing multiple sources of the liquid, each having a different viscosity. Furthermore, while the angular velocity of the substrate can be used to control the thickness of the liquid layer (for example, by increasing the angular velocity to reduce the layer thickness), this technique is limited because at high angular velocities, the liquid can form waves or other disturbances, as discussed above.

FIG. 1 is a partially schematic, partially cutaway side elevation view of a conventional device 10 that can address some of the foregoing problems for rectangular substrates. The device 10 includes a motor 30 having a shaft 32 connected to a chuck 33 and a bowl 20. A substrate 12 having a rectangular planform shape is releasably mounted to the chuck 33 and both the substrate 12 and the bowl 20 spin as the shaft 32 rotates. Accordingly, the air adjacent to the substrate 12 is partially contained within the spinning bowl 20 so that at least a portion of the air will spin at the same rate as the substrate 12. A fluid supply conduit 23 disposes a liquid onto the substrate 12 through an aperture 24 and the liquid spreads out over the surface of the substrate 12 as the substrate 12 spins. Excess liquid is collected in the bowl 20 as it runs over the edges of the substrate 12 and can be removed from the bowl via a drain 21. Air can be exhausted from the bowl 20 through an exhaust port 22.

One potential drawback with the device 10 shown in FIG. 1 is that the bowl 20 can be heavy and difficult to spin smoothly at high rates of speed. Furthermore, the drain 21 and the exhaust port 22 may be coupled to a drain line 23a and an exhaust line 23b, respectively, which must be secured to the bowl 20 with fluid-tight rotating couplings. Still further, the bowl 20 is partially open so that it may be time consuming to bring the air mass adjacent to the substrate 12 up to the same rotational speed as the substrate 12, particularly where the substrate 12 rotates at high speed.

FIG. 2 is a partially schematic, partially cutaway side elevation view of another conventional device 10a that includes a motor 30a coupled with a shaft 32a to a chuck 33a. The chuck 33a includes a rectangular recess 36 for receiving the rectangular substrate 12. A cover 40 is releasably placed on the chuck 33a to rotate with the chuck 33a and the substrate 12. The cover 40 includes an aperture 41 that allows fluid to pass from the fluid supply conduit 23 to the surface of the substrate 12. The apparatus 10a can further include a collection vessel 20a fixed relative to the motor 30a and having a drain 21 and an exhaust port 22 for removing liquid and gas from the region adjacent to the substrate 12.

One problem with the device 10a shown in FIG. 2 is that the liquid disposed on the substrate 12 can become trapped between the lower surface of the substrate 12 and the walls of the recess 36 into which the substrate 12 is placed. A further drawback is that the recess 36 is sized for rectangular substrates 12, making it unsuitable for or unusable with round substrates, particularly where the diameter of the round substrate exceeds the width of the recess 36.

SUMMARY OF THE INVENTION

The present invention is directed toward methods and apparatuses for uniformly distributing a liquid over a surface of a spinning microelectronic substrate. An apparatus in accordance with one aspect of the invention can include a support having an engaging portion for engaging the microelectronic substrate and rotating the microelectronic substrate at a first rate. The microelectronic substrate can have a first surface that receives the liquid and a second surface facing opposite the first surface with the engaging portion configured to engage less than the entire second surface. A rotating barrier proximate to the support rotates at a second rate approximately equal to the first rate to separate a first portion of gas adjacent the microelectronic substrate and rotating with the microelectronic substrate from a second portion of gas spaced apart from the microelectronic substrate and generally stationary relative to the microelectronic substrate.

In a method in accordance with an aspect of the invention, a liquid having a single viscosity can be distributed over the first surface of the substrate to a generally uniform thickness ranging from a first value to a second value approximately 3,000 Angstroms greater than the first value by positioning a barrier to separate a rotating first volume of gas adjacent the first surface from a generally stationary second volume of gas. For example, the 3,000 Angstrom range can extend from about 5,000 Angstroms to about 8,000 Angstroms, or from about 7,000 Angstroms to about 10,000 Angstroms. The viscosity can be selected to be from about six centipoise to about twenty centipoise and the liquid can be distributed to a thickness that varies by less than twenty Angstroms.

DETAILED DESCRIPTION OF THE INVENTION

The present invention is directed toward methods and apparatuses for distributing liquid over the surfaces of microelectronic substrates and/or substrate assemblies. Many specific details of certain embodiments of the invention are set forth in the following description and in FIGS. 3 and 4 to provide a thorough understanding of such embodiments. One skilled in the art, however, will understand that the present invention may have additional embodiments, or that the invention may be practiced without several of the details described in the following description.

Figure 1:
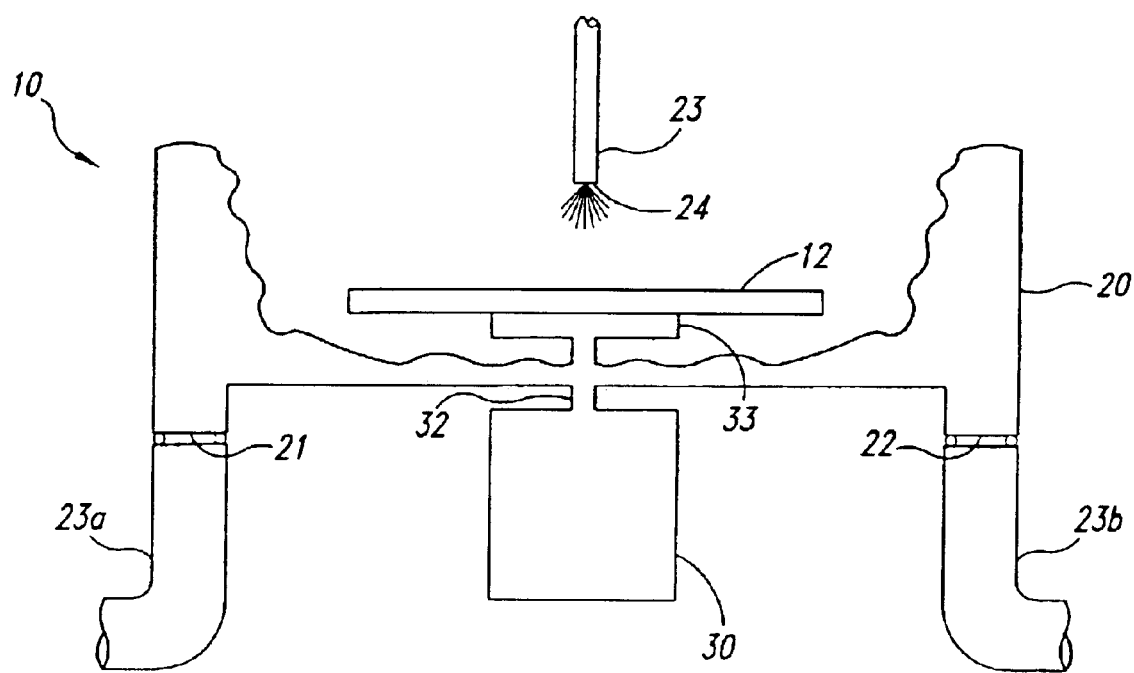
FIG. 1 is a partially schematic, partially cutaway side elevation view of an apparatus in accordance with the prior art.
Figure 2:
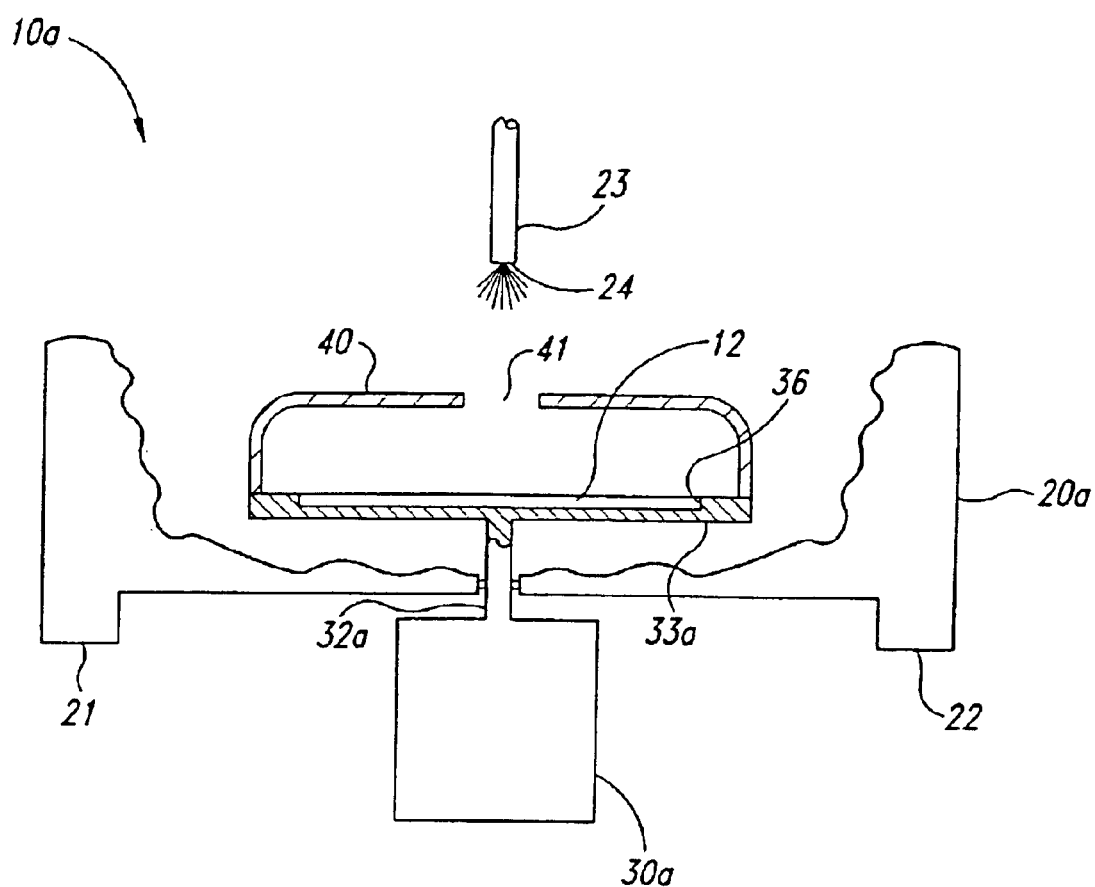
FIG. 2 is a partially schematic, partially cutaway side elevation view of another apparatus in accordance with the prior art.
Figure 3:
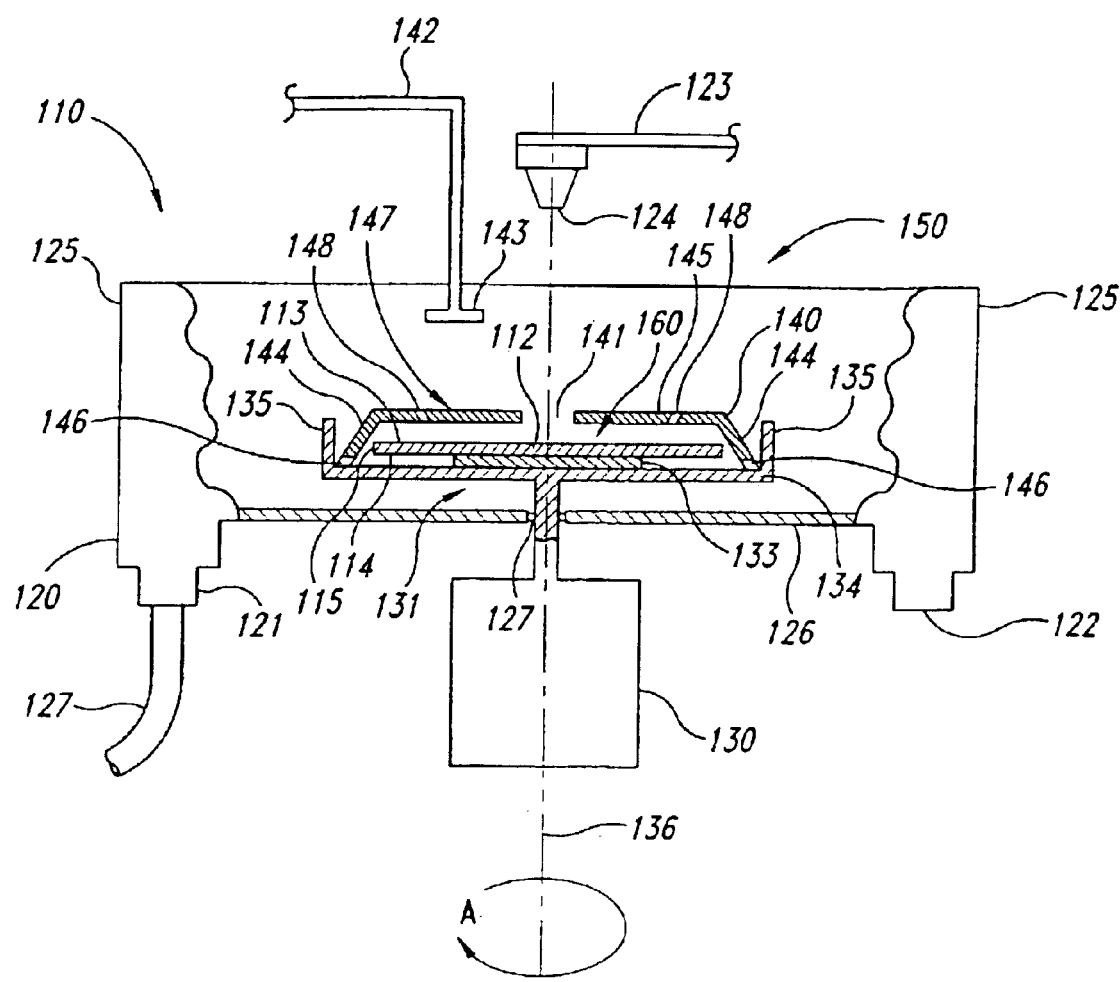
FIG. 3 is a partially schematic, partially cutaway side elevation view of an apparatus in accordance with an embodiment of the invention.

FIG. 3 is a partially schematic, partially cutaway side elevation view of an apparatus 110 that spins a substrate 112 and a barrier 140 at approximately the same rate to distribute a liquid over the substrate 112 in accordance with an embodiment of the invention. The substrate 112 can have a generally round planform shape and a diameter of at least approximately eight inches. For example, in one embodiment, the substrate 112 can have a diameter of approximately twelve inches and in other embodiments the substrate 112 can have other diameters and shapes so long as it can be adequately supported by the apparatus 110 and so long as the liquid can be distributed on the substrate 112 in a uniform manner.

The apparatus 110 can include a motor 130 coupled with a drive shaft 132 to a support assembly 131 to rotate the support assembly about an axis 136 as indicated by arrow A. The support assembly 131 can include a substrate support 133 that supports the substrate 112 such that an upper surface 113 and an outer portion of a lower surface 114 of the substrate 112 are exposed. Accordingly, the substrate support 133 can have a lateral extent perpendicular to the axis 136 that is less than the lateral extent of the substrate 112 in the same direction, i.e., the substrate 112 can overhang the substrate support 133.

The support assembly 131 can further include a barrier support 134 that extends radially outwardly beyond the substrate support 133 and the substrate 112 to support and rotate the barrier 140 as the support assembly 131 rotates. The barrier support 134 can include a plurality of spaced apart stanchions 135 to restrict radial motion of the barrier 140 relative to the barrier support 134. Alternatively, the barrier 140 can rotate independently of the substrate 112, as will be discussed in greater detail below with reference to FIG. 4.

In one embodiment, the barrier 140 has a generally circular planform shape and extends around and over the substrate 112 to separate a stationary, external air volume 150 outside the barrier 140 from a rotating, internal air volume 160 inside the barrier 140. Accordingly, the barrier 140 can be coupled to the drive shaft 132 via the barrier support 134 to spin at the same rate as the substrate 112. The barrier 140 can include an upper wall 145 facing and generally parallel to the upper surface 113 of the substrate 112. The barrier 140 can also include sidewalls 144 extending downwardly from the upper wall 145 to the barrier support 134. In one aspect of this embodiment, the upper wall 145 and the sidewalls 144 can be spaced apart from the substrate 112 by relatively small distances (exaggerated in FIG. 3 for purposes of illustration) to keep the volume of the internal air volume 160 relatively small. For example, the upper wall 145 can be separated from the upper surface 113 of the substrate 112 by a distance of at least approximately one millimeter to approximately ten millimeters, or some other spacing. The sidewalls 144 can be separated from an outer edge 115 of the substrate 112 by a distance of from approximately five millimeters to approximately ten millimeters or some other distance. An advantage of this feature is that it can reduce the time required to spin the internal air volume 160 up to the same speed as the substrate 112.

The upper wall 145 of the barrier 140 can include an aperture 141 aligned with a nozzle aperture 124 of a liquid supply conduit 123 to allow liquid to descend from the nozzle aperture 124 to the upper surface 113 of the substrate 112. The upper surface 145 can also include an engagement portion 147 for positioning the barrier 140. For example, the apparatus 110 can include a control arm 142 having a positioning head 143 for releasably engaging with the engagement portion 147 of the barrier 140. Once the positioning head 143 is engaged with the barrier 140, the control arm 142 can move the barrier 140 toward and away from the barrier support 134, for example during installation or removal of the substrate 112 from the substrate support 133. In one aspect of this embodiment, the positioning head 143 can be coupled to a vacuum source (not shown) to grip the barrier 140 with a suction force and the control arm 142 can be remotely actuated to move the barrier 140 toward and away from the barrier support 134. In other embodiments, the control arm 142 and the positioning head 143 can have other arrangements for positioning the barrier 140.

The sidewalls 144 of the barrier 140 can be sloped to define a frustum of a cone, or alternatively, the sidewalls 144 can be vertical to define a cylindrical section or have some other configuration. The sidewalls 144 can include drain holes 146 adjacent to the barrier support 134 positioned such that liquid flowing off the substrate 112 can flow through the drain holes 146 and through the spaces between the stanchions 135. In other embodiments, the barrier 140 can have other shapes and configurations that separate the external air volume 150 from the internal air volume 160 and allow excess liquid to drain away from the substrate 112.

In one embodiment, the nozzle aperture 124, the substrate 112, and the drive shaft 132 are each aligned with the axis 136 so that the substrate 112 spins about its center and the nozzle aperture 124 dispenses the liquid to the center of the substrate upper surface 113. In one embodiment, the liquid supply conduit 123 can be coupled to a source of liquid (not shown) that includes a photoresist material for etching the substrate 112 generally as discussed above. Alternatively, the liquid supply conduit 123 can be coupled to sources of other liquids.

The apparatus 110 can further include a collection vessel 120 fixed relative to the motor 130 and disposed coaxially around the drive shaft 132 and the substrate 112 to collect excess liquid flowing from the substrate 112. The collection vessel 120 can include a base. 126 extending outwardly from the driveshaft 132 beneath the substrate 112, and walls 125 extending upwardly around the substrate 112. Accordingly, the collection vessel 120 can collect liquid that spills over the edge 115 of the substrate 112 as the substrate 112 spins. A seal 127 between the drive shaft 132 and the base 126 prevents the liquid collected in the collection vessel 120 from leaking around the drive shaft 132. A drain 121 below the base 126 conducts the collected liquid away from the collection vessel 120 via a drain tube 127. The collection vessel 120 can also include an exhaust port 122 having an adjustable flow area to control a flow of air past the substrate 112 and out of the collection vessel 125.

In a method in accordance with one embodiment of the invention, the control arm 142 positions the barrier 140 on the barrier support 134 and the substrate 112 and the barrier 140 rotate together until the internal air volume 160 is spinning at approximately the same rate as the substrate 112. The liquid supply conduit 123 then disposes the liquid onto the upper surface 113 of the substrate 112, where it flows outwardly under centrifugal force toward the edges of the substrate 112. In one aspect of this embodiment, the rotation speed of both the substrate 112 and the barrier 140 can be up to 4,000 rpm, and in a further aspect of this embodiment, the rotation speed can be in the range of from approximately 2,000 rpm to approximately 4,000 rpm or some other rotational velocity.

In an alternate method, the liquid supply conduit 123 can dispose the liquid on the substrate 112 before the substrate 112 spins up to an initial, relatively low speed without the barrier 140 in place. The initial rotation speed can be selected to be lower than the lowest speed at which the liquid forms non-uniformities with the adjacent air mass (for example, approximately 1,000 rpm). The control arm 142 can then lower the barrier 140 into place on the spinning barrier support 134 and release the barrier 140. The rotation rate of the substrate 112 and the barrier 140 can be gradually increased to a higher rpm (for example up to 4,000 rpm), causing the liquid to spread out over the upper surface 113 while at the same time spinning the internal air volume 160 up to the same rotation rate of the substrate 112 and the barrier 140.

In still another method, gas can be selectively removed from the internal air volume 160 as the substrate 112 and the barrier 140 rotate. For example, the exhaust port 122 can be open continuously or periodically to withdraw gaseous or gas-borne constituents from within the barrier 140. Accordingly, the barrier 140 and/or the barrier support 134 can have vents 148 (in addition to the drain holes 146) that allow some fluid communication between the internal air volume 160 and the external air volume 150. For example, gas can pass out of the internal air volume 160 through the drain holes 146 and into the internal air volume 160 through the vents 148. Alternatively, the barrier 140 can be periodically lifted from the barrier support to allow gas to escape from within the barrier 140.

In any of the methods discussed above with reference to FIG. 3, rotating the internal air volume 160 can reduce the likelihood for the liquid to form waves or other non-uniformities on the upper surface 113 of the substrate 112, particularly toward the outer edge of the substrate 112. Rotating the internal air volume 160 can also reduce the rate of convective heat transfer from the substrate 112. Accordingly, the liquid can be deposited to a more uniform thickness over the entire upper surface 113. For example, in one embodiment, the liquid can be deposited to a thickness that varies from about ten Angstroms to about thirty Angstroms across the surface of a substrate 112 having a diameter of greater than eight inches (up to and exceeding twelve inches). In another embodiment, the liquid can be deposited to a thickness that varies by no greater than about ten Angstroms across the surface of the substrate 112, or the liquid can be deposited to thicknesses with other thickness variations on substrates 112 having other diameters.

Furthermore, a liquid having a single viscosity can be used to produce layers on the substrate 112 having a greater range of thicknesses than is possible without the barrier 140. For example, in one embodiment, a fluid having a single viscosity value of between about five centipoise and about twenty centipoise can be deposited on a substrate 112 (having a diameter of greater than eight inches, up to and exceeding twelve inches) to a selected uniform thickness within a range of approximately 3,000 Angstroms. In one embodiment, a liquid having a viscosity of from about five centipoise to about ten centipoise can be deposited on the substrate 112 to a thickness of from approximately 5,000 Angstroms to approximately 8,000 Angstroms by rotating the substrate 112 at a speed of from about 2,000 rpm to about 4,000 rpm. The particular viscosity value and rotation rate selected to produce the desired thickness can be selected based on such factors as evaporation rate of the liquid. In another embodiment, the thickness can range from approximately 7,000 Angstroms to approximately 10,000 Angstroms by depositing on the substrate 112 a liquid having a viscosity of from about ten centipoise to about twenty centipoise and spinning the substrate at from about 2,000 rpm to about 4,000 rpm. This is unlike some conventional devices, which may require coupling the liquid supply conduit 123 to a plurality of liquid sources (each having a different viscosity) to deposit liquid layers of different thicknesses on different substrates 112.

Another feature of the apparatus and methods discussed above with reference to FIG. 3 is that the substrate 112 can be supported in a manner that does not trap the fluid against the lower surface 114 of the substrate 112, while at the same time eliminating the need for rotating the collection vessel 120, unlike some conventional apparatuses. Accordingly, the lower surface 114 of the substrate 112 can remain relatively free of contaminants while the liquid is disposed on the upper surface 113. Furthermore, the apparatus 110 can be simpler to manufacture and operate because the collection vessel 120 is fixed relative to the motor 130, eliminating the need for rotating seals between the drain 121 and the drain line 127.

Figure 4:
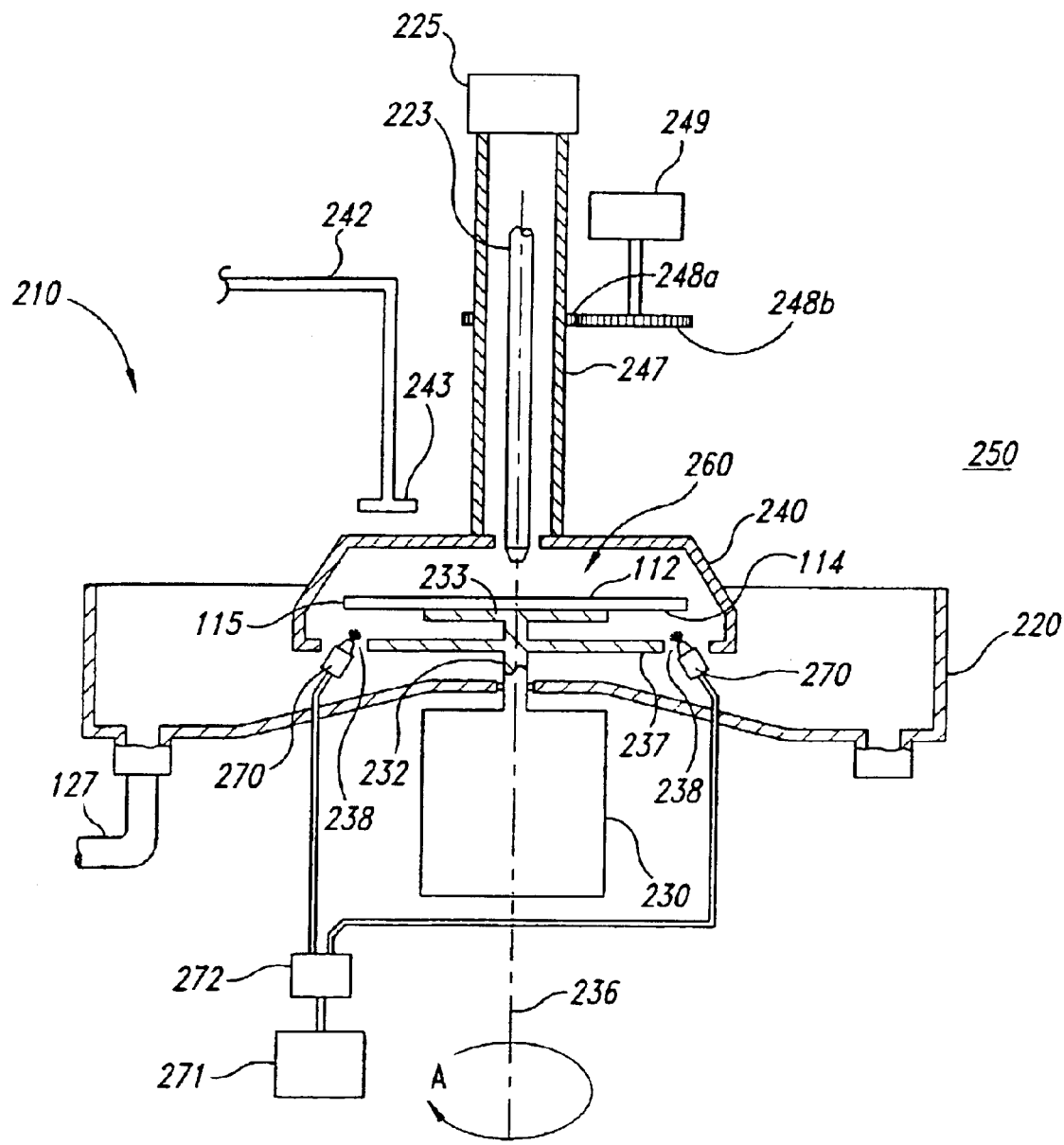
FIG. 4 is a partially schematic, partially cutaway side elevation view of an apparatus in accordance with another embodiment of the invention.

FIG. 4 is a partially schematic, partially cutaway side elevation view of an apparatus 210 having a barrier 240 that rotates independently of the substrate 112 in accordance with another embodiment of the invention. The apparatus 210 can include a motor 230 having a drive shaft 232 coupled to a substrate support 233 that supports the substrate 112. The drive shaft is rotatable about an axis 236, as indicated by arrow A in a manner generally similar to that discussed above with reference to FIG. 3. The apparatus 210 can further include a collection vessel 220 disposed annularly around the drive shaft 232 and the substrate 112 to collect fluid and to exhaust air, also in a manner generally similar to that discussed above with reference to FIG. 3.

The barrier 240 can include a barrier shaft 247 that extends upwardly and annularly around a liquid supply conduit 223. The barrier shaft 247 can be coupled to a motor 249 (for example, via gears 248a and 248b) to rotate the barrier 240. Accordingly, the barrier 240 can rotate at a rate independent of the rate at which the substrate 112 and the substrate support 233 rotate. In one aspect of this embodiment, the rate at which the barrier 240 rotates can be matched to the rate at which the substrate 112 rotates so that an internal air volume 260 within the barrier 240 rotates with the barrier 240 and the substrate 112, while an external air volume 250 remains approximately stationary, in a manner generally similar to that discussed above with reference to FIG. 3.

In one embodiment, a flange 237 can be connected to the drive shaft 232 and can extend radially outwardly beneath the substrate support 233. The barrier 240 extends above and around the substrate 112 and is spaced apart from the flange 237 to define an annular gap 238 between the flange and the barrier 240. In one embodiment, a plurality of nozzles 270 can be positioned in the gap 238 and can be coupled to a source of cleaning fluid 271. Accordingly, the nozzles 270 can direct the cleaning fluid toward the lower surface 114 of the substrate 112 to remove contaminants from the lower surface. In one embodiment, the source 271 can be coupled to a temperature controller 272 to control the temperature of the substrate 112 and the evaporation rate of the liquid disposed on the upper surface 113 of the substrate 112.

In a further aspect of the embodiment shown in FIG. 4, the gap 238 between the barrier 240 and the flange 237 can extend outwardly beyond an outer edge 115 of the substrate 112 so that the barrier 240 can be lifted upwardly to access the substrate 112, for example to remove the substrate 112 after the liquid is disposed on the substrate 112. In a further aspect of this embodiment, the barrier 240 can be lifted with a control arm 242 having a positioning head 243, in a manner generally similar to that discussed above with reference to FIG. 3. Alternatively, the barrier shaft 247 can be directly coupled to an axial actuator 225 to move the barrier 240 upwardly and downwardly.

A feature of the apparatus shown in FIG. 4 is that the barrier 240 can be rotated independently of the substrate 112, while still allowing the barrier 240 to rotate at the same rate as the substrate 112. Conversely, a feature of the apparatus 110 discussed above with reference to FIG. 3 is that the barrier 140 will always rotate at the same rate as the substrate 112 when the barrier 140 is supported by the barrier support 134, ensuring that the internal air volume 160 will spin at the same rate as the substrate 112.

From the foregoing, it will be appreciated that, although specific embodiments of the invention have been described herein for purposes of illustration, various modifications may be made without deviating from the spirit and scope of the invention. For example, where the environment adjacent the substrate includes gases other than air, the barriers discussed above with reference to FIGS. 3 and 4 can separate the other gases into an internal volume and an external volume. Accordingly, the invention is not limited except as by the appended claims.

What is claimed is:

1. An apparatus for disposing a fluid onto a first surface of a microelectronic substrate, the microelectronic substrate having a second surface opposite the first surface, the apparatus comprising:

a support having an engaging portion for engaging the microelectronic substrate, the support being rotatable about a rotation axis, the engaging portion being configured to engage less than the entire second surface of the microelectronic substrate;

a conduit having an opening positioned proximate to the support for disposing the fluid on the first surface of the microelectronic substrate;

a fixed retaining vessel positioned proximate to the support to collect fluid from the microelectronic substrate, the engaging portion of the support being rotatable relative to the fixed vessel;

a plurality of nozzles configured to direct a cleaning fluid toward the second surface of the microelectronic substrate;

a barrier coupled to the support and rotatable with the engaging portion relative to the vessel, the barrier being spaced apart from and proximate to the microelectronic substrate to separate a first portion of gas adjacent the microelectronic substrate and rotating with the microelectronic substrate from a second portion of gas spaced apart from the microelectronic substrate and generally stationary relative to the microelectronic substrate; and the support includes a flange extending radially outwardly from the rotation axis, the barrier being spaced apart from the flange to define a gap between the flange and the barrier facing toward the second surface of the microelectronic substrate, and wherein the plurality of nozzles extend through the gap to direct the cleaning fluid toward the second surface of the microelectronic substrate.

2. The apparatus of claim 1 wherein the retaining vessel has a base, sidewalls extending upwardly from the base, and an upwardly facing opening for collecting fluid from the microelectronic substrate.

3. The apparatus of claim 1 wherein the retaining vessel is positioned beneath the support.

4. The apparatus of claim 1 wherein the retaining vessel includes at least one port for removing fluid collected in the retaining vessel.

5. The apparatus of claim 1 wherein at least a portion of the barrier is generally parallel to the surface of the substrate and has an opening for the fluid to pass through.

6. The apparatus of claim 1 wherein the barrier is removably attached to the support and movable relative to the support between an attached position and a detached position.

7. The apparatus of claim 1, wherein the microelectronic substrate has a generally circular planform shape.

8. The apparatus of claim 7 wherein the microelectronic substrate has a diameter greater than approximately eight inches.

9. The apparatus of claim 7 wherein the microelectronic substrate has a diameter of approximately twelve inches.

10. The apparatus of claim 1, further comprising the fluid, the fluid having a viscosity in the range of between five centipoise and twenty centipoise.

11. The apparatus of claim 1, further comprising the fluid, the fluid including a photoresist material.

* * * * *